(12) United States Patent
Cheung et al.

(10) Patent No.: US 12,002,892 B2
(45) Date of Patent: Jun. 4, 2024

(54) SEMICONDUCTOR DEVICE WITH EMBEDDED SCHOTTKY DIODE AND MANUFACTURING METHOD THEREOF

(71) Applicant: Alpha Power Solutions Limited, Hong Kong (CN)

(72) Inventors: Wing Kit Cheung, Hong Kong (CN); Wai Tien Chan, Hong Kong (CN); Wing Chong Tony Chau, Hong Kong (CN); Ho Nam Lee, Hong Kong (CN); Qian Sun, Hong Kong (CN)

(73) Assignee: Alpha Power Solutions Limited, Hong Kong (CN)

( * ) Notice: Subject to any disclaimer, the term of this patent is extended or adjusted under 35 U.S.C. 154(b) by 137 days.

(21) Appl. No.: 17/929,766

(22) Filed: Sep. 6, 2022

(65) Prior Publication Data

US 2022/0416093 A1    Dec. 29, 2022

Related U.S. Application Data

(62) Division of application No. 16/947,556, filed on Aug. 6, 2020, now Pat. No. 11,476,370.

(51) Int. Cl.
| | |
|---|---|
| *H01L 29/66* | (2006.01) |
| *H01L 21/28* | (2006.01) |
| *H01L 29/06* | (2006.01) |
| *H01L 29/16* | (2006.01) |
| *H01L 29/78* | (2006.01) |
| *H01L 29/872* | (2006.01) |

(52) U.S. Cl.
CPC ........ *H01L 29/872* (2013.01); *H01L 21/2815* (2013.01); *H01L 29/0619* (2013.01); *H01L 29/1608* (2013.01); *H01L 29/66143* (2013.01); *H01L 29/7806* (2013.01)

(58) Field of Classification Search
CPC ........ H01L 2924/12032; H01L 29/872–8725; H01L 27/0766; H01L 51/0579
See application file for complete search history.

(56) References Cited

U.S. PATENT DOCUMENTS

| | | | | |
|---|---|---|---|---|
| 2007/0241338 | A1* | 10/2007 | Yamamoto | .......... H01L 29/0843 |
| | | | | 257/E29.313 |
| 2015/0214164 | A1* | 7/2015 | Matocha | ................ H01L 23/26 |
| | | | | 257/77 |
| 2016/0233210 | A1* | 8/2016 | Matocha | ............... H01L 21/046 |
| 2022/0013663 | A1* | 1/2022 | Kawahara | ......... H01L 29/66068 |

\* cited by examiner

*Primary Examiner* — Moin M Rahman
(74) *Attorney, Agent, or Firm* — S&F/WEHRW

(57) ABSTRACT

One embodiment provides a semiconductor device. The device comprises a substrate having a first face and a second face, a well region, a source region disposed in the well region, a contact region contacting the well region and the source region, a Schottky region, and a source metal layer. A first part of the source metal layer contacts the Schottky region to form a Schottky diode. The Schottky region is surrounded by the contact region and the well region in a first plane perpendicular to a direction from the first face toward the second face.

6 Claims, 11 Drawing Sheets

SEMICONDUCTOR DEVICE WITH EMBEDDED SCHOTTKY DIODE AND MANUFACTURING METHOD THEREOF

CROSS-REFERENCE TO RELATED APPLICATIONS

This application is a divisional application of U.S. patent application Ser. No. 16/947,556, filed Aug. 6, 2020 which is entitled "Semiconductor Device with Embedded Schottky Diode And Manufacturing Method Thereof," the disclosure of which is hereby incorporated by reference herein in its entirety.

FIELD

The present invention relates to semiconductor field, and more specifically to semiconductor devices and methods thereof.

BACKGROUND

Semiconductor devices, such as silicon carbide (SiC) semiconductor devices (e.g., such as silicon carbide metal-oxide semiconductor field-effect transistors (MOSFET)), have a wide range of applications, such as for power devices for electric vehicles. However, the existing device structures have many shortcomings, such as a large cell pitch. This not only makes the device larger in size and lower in chip density, thereby increasing the cost, but also affects the switching speed of the device, which is not applicable to high-speed applications.

New semiconductor devices and manufacturing methods that assist in advancing technological needs and industrial applications in semiconductor devices and fabrication processes are desirable.

SUMMARY

According to one aspect of the embodiments, it is provided with a semiconductor device. The semiconductor device comprises a substrate of a first conductivity type and having a first face and a second face, a well region of a second conductivity type, a source region disposed in the well region and extending from the first face toward the second face, a contact region disposed in the substrate and extending from the first face toward the second face, a Schottky region extending from the first face toward the second face, and a source metal layer disposed on the first face. The contact region contacts the well region and the source region. The Schottky region is a part of the substrate. A first portion of the source metal layer contacts the Schottky region to form a Schottky diode. The Schottky region is surrounded by the well region and the contact region in a first plane perpendicular to a direction from the first face toward the second face.

Other example embodiments are discussed herein.

DETAILED DESCRIPTION

Example embodiments relate to semiconductor device with embedded Schottky diode and manufacturing methods thereof with various advantages, such as improved device performance.

Semiconductor devices and methods thereof in accordance with one or more embodiments as described herein have various technical advantages. For example, compared with the prior art, the semiconductor devices according to one or more embodiments have small device size, high switching speed, and high chip density. This not only reduces chip manufacturing cost, but also expands the application range, such as being suitable for high-speed applications. The semiconductor devices according to one or more embodiments overcome the shortcomings of body diodes embedded in a semiconductor device (such as MOSFET) in prior art, thereby improving device performance. Methods according to one or more embodiments do not need to add new process steps, especially expensive masks. Methods according to one or more embodiments adopt a self-aligning method to design the window of the hard masks in a novel way, and the Schottky diode can be embedded into the device. Methods according to one or more embodiments can manufacture semiconductor devices with improved performance without sacrificing process complexity, and thereby are cost-effective in the meanwhile.

Figure 1:
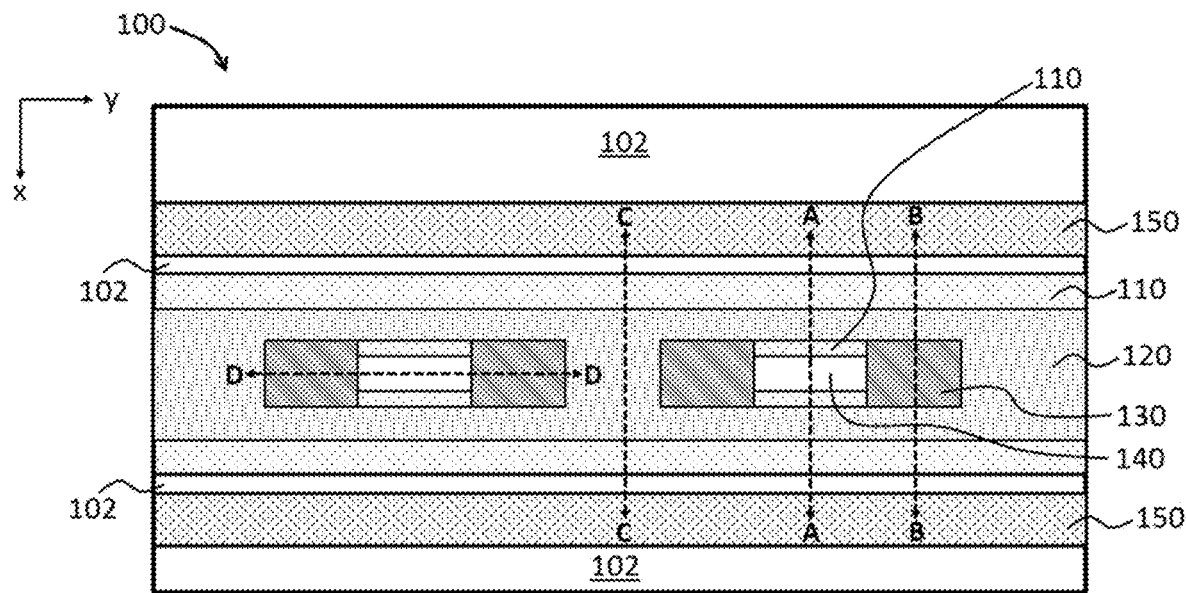
FIG. 1 is a plan view of a semiconductor device according to a first embodiment of the present invention.

FIG. 1 is a plan view of a semiconductor device according to a first embodiment. FIGS. 2A-2D are schematic diagrams of the cross-sectional structure of FIG. 1 along lines AA, BB, CC, and DD respectively. For purpose of concise, each diagram shows a part of device structure, such as a typical part. When the device includes multiple repeating units, only one or several repeating units are shown.

As shown, the semiconductor device 100 includes a substrate 102, a well region 110, a source region 120, a contact region 130, a Schottky region 140, and a source metal layer 180. The substrate 102 is of a first conductivity type (such as N-type), and has a first face 102a and a second face 102b. The first face 102a is opposite to the second face 102b. The well region 110 is of a second conductivity type (such as P type). The well region 110 is disposed in the substrate 102 and extends from the first face 102a toward the second face 102b (the z direction in FIGS. 2A-2D). The source region 120 is of the first conductivity type. The source region 120 is disposed in the well region 110 and extends from the first face 102a toward the second face 102b. The contact region 130 is of the second conductivity type. The contact region 130 is disposed in the substrate 102 and extends from the first face 102a toward the second face 102b. The contact region 130 contacts the well region 110 and the source region 120. The Schottky region 140 extends in a direction from the first face 102a toward the second face 102b. The Schottky region 140 is a part of the substrate 102.

The source metal layer 180 is disposed on the first face 102a, and at least a portion (e.g., a first portion) of the source metal layer 180 contacts the Schottky region 140 to form a Schottky diode or Schottky contact 182. In addition, at least another portion (e.g., a second portion) of the source metal layer 180 forms an ohmic contact 184 with the contact region 130. At least a further portion (e.g., a third portion) of the source metal layer 180 contacts the source region 130 to form an ohmic contact 186.

The depth of the contact region 130 and the well region 110 (i.e., the depth along the z direction in the xz plane) can be set according to actual needs. For example, in one embodiment, the depth of the well region 110 ranges from 0.6 micrometers (um) to 1.8 um. The depth, for example, may be 0.6 um, 0.8 um, 1.0 um, 1.2 um, 1.4 um, 1.6 um, 1.8 um, etc. The depth of the contact region 130 ranges from 0.4 um to 1.8 um. The depth, for example, may be 0.4 um, 0.8 um, 1.2 um, 1.6 um, 1.8 um, etc. In some other embodiments, other depth values are also possible.

As shown in FIGS. 2A-2D, a dielectric layer 160 and a gate 170 are also provided on the first face 102. The dielectric layer 160 is used herein for simplification of description. The dielectric layer 160 may include, for example, a first dielectric layer and a second dielectric layer. The first dielectric layer is, for example, a gate oxide layer (such as silicon dioxide), and the gate oxide layer is disposed between the first face 102a and the gate 170. The second dielectric layer is, for example, an interlayer dielectric (such as plasma-enhanced tetraethylorthosilicate, PETEOS, or other oxides) for covering the gate 170 so that the gate 170 is electrically isolated from the source metal layer 180, and the gate 170 is protected, etc. The gate 170 is, for example, a doped polysilicon layer.

In addition, the semiconductor device 100 is also provided with a junction gate field-effect transistor (JFET) region 150. The JFET region 150 is disposed beneath at least a part of the gate 170. The JFET region 150 is disposed in the substrate 102 and extends from the first face 102a toward the second face 102b. The JFET region 150 is of the first conductivity type. The impurity concentration of the JFET region 150 may be the same as the impurity concentration of a part of the substrate 102, or may have a higher impurity concentration. The depth and impurity profile of the JFET region 150 can be adjusted according to actual needs.

With reference to FIG. 1 again, in at least one plane (e.g., the first plane, which is exemplified as the xy plane in FIG. 1) perpendicular to the direction (e.g., along z axis) of the first face 102a toward the second face 102b, the Schottky region 140 is surrounded by the well region 110 and the contact region 130. The boundary of the Schottky region 140 is exemplified as a quadrilateral. The opposite sides in the x direction (first opposite sides) are in contact with the well region 110, and the opposite sides in the y direction (the second opposite sides) are in contact with the contact region 130. At least along a first direction (the first direction, for example, is the x direction in the present embodiment), the length of at least one side of the boundary of the Schottky region 140 ranges from 0.8 um to 2.5 um. The length may be, for example, 0.8 um, 1.0 um, 1.2 um, 1.5 um, 1.8 um, 2.2 um, 2.5 um, etc. In other embodiments, other length values are also possible.

In addition, the JFET region 150 separates the well regions 110 in at least one direction (e.g., the x direction in the present embodiment) within the first plane. For example, the JFET region 150 and at least a part of the substrate 102 are provided between adjacent well regions 110.

In the prior art, the width of a source contact is usually equal to the width of a part of a source region plus the width of a contact region. According to device design of the present embodiment, such as referring to FIG. 2B, the width of the source contact is equal to the width W of the contact region 130 along the x direction in the xz plane. That is, compared with the prior art, the device structure according to the present embodiment can realize a smaller cell pitch, thereby reducing device area and increasing chip density, which is cost-effective. In addition, a smaller device area is favorable to device's switching speed, which contributes at least partly to suitability for fast switching applications.

Further, a semiconductor device usually has parasitic body diodes. The characteristics of the body diodes have a non-negligible effect on the overall performance of the device. For many semiconductor devices, such as SiC devices, the body diodes have a high turn-on voltage (for example, up to 4V). This is usually unfavorable as it is difficult to turn on the body diodes during operation, thereby greatly reducing the operating speed of the semiconductor device and making the device unsuitable for high-speed device applications. The device structure according to the present embodiment, by embedding a Schottky diode, can greatly improve the turn-on capability of the body diodes (for example, for a SiC device, the turn-on voltage of the Schottky diode may be lower than 1.0V).

According to some embodiments, one or more JFET regions are also embedded, which can further reduce the body resistance of the semiconductor device and improve the current capability of the MOSFET, thereby improving the overall current capability of the whole semiconductor device. Those skilled in the art should understand that the JFET region is not necessary. The semiconductor devices according to some embodiments are not provided with any JFET region.

Figure 2A:
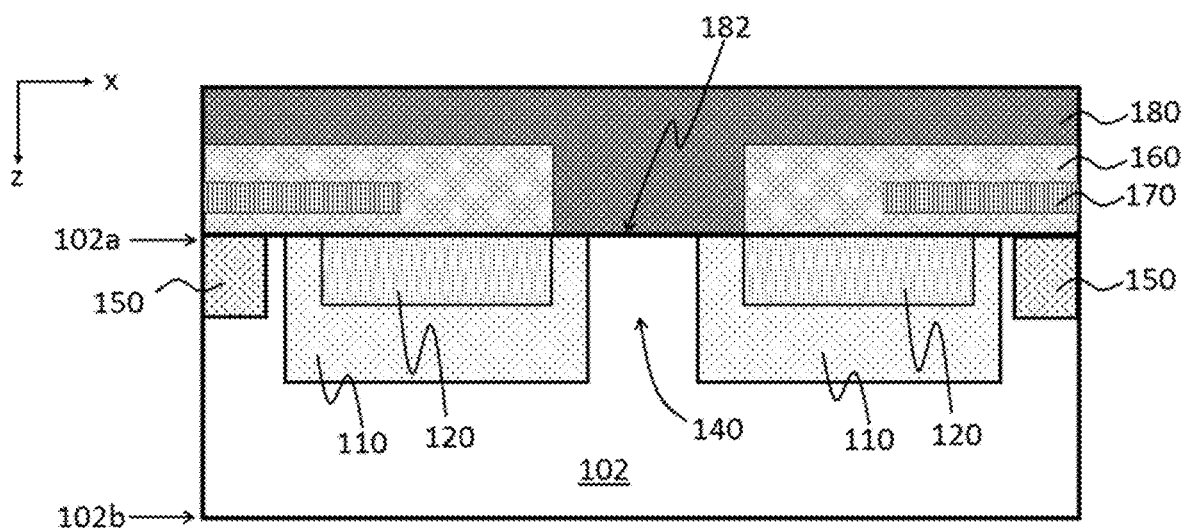
FIG. 2A is a schematic cross-sectional structure view along AA in FIG. 1.
Figure 2B:
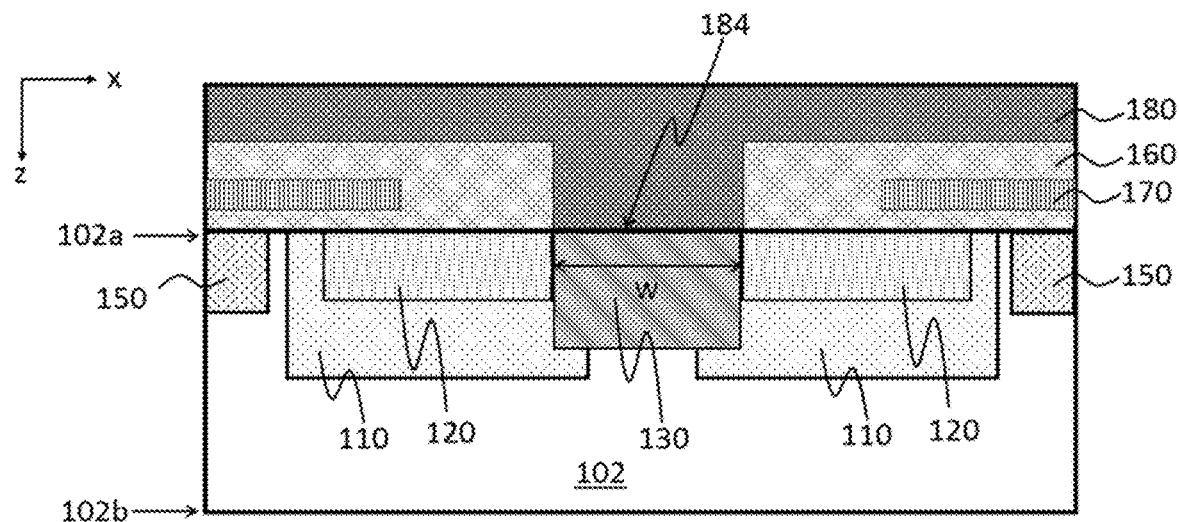
FIG. 2B is a schematic cross-sectional structure view along BB in FIG. 1.
Figure 2C:
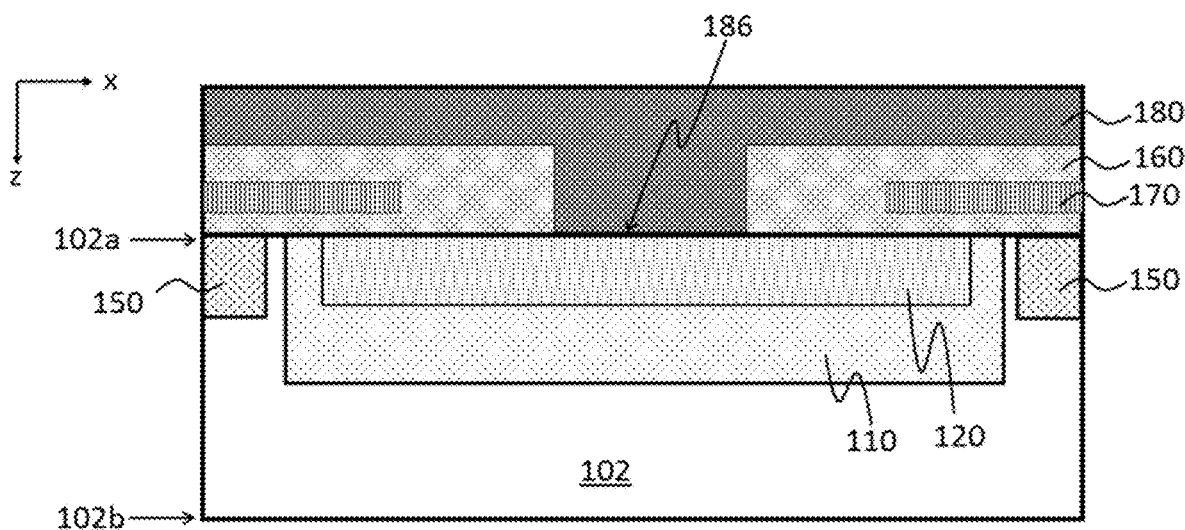
FIG. 2C is a schematic cross-sectional structure view along CC in FIG. 1.
Figure 2D:
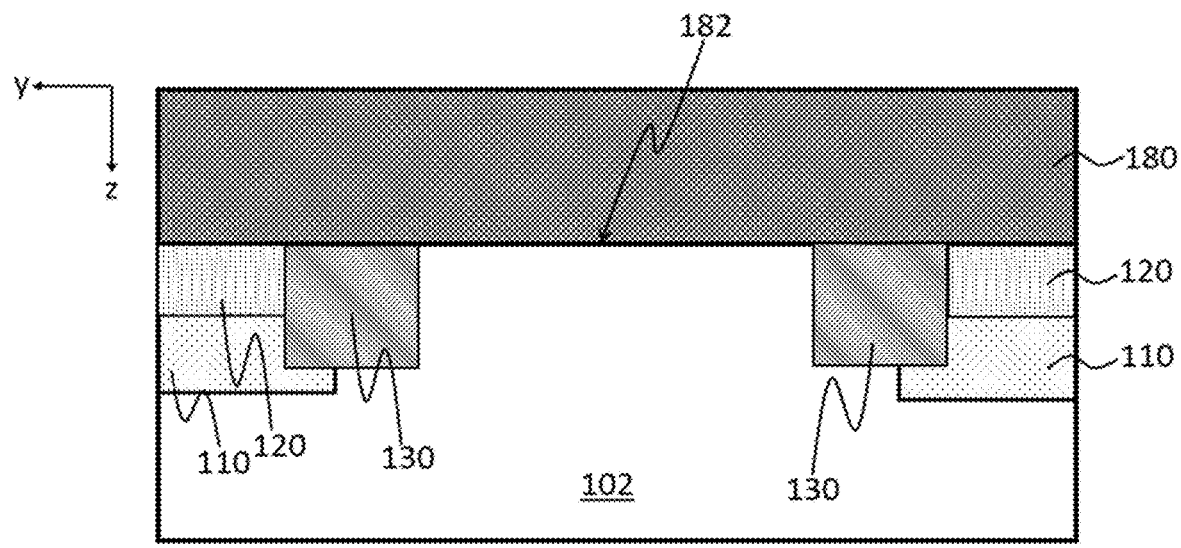
FIG. 2D is a schematic cross-sectional structure view along DD in FIG. 1.

It would be appreciated by those skilled in the art that in the FIGS. 2A-2B, one or more metal layers would be disposed on the second face 102b to form ohmic contact. These one or more metal layers may function as a drain metal layer or drain contact. As arrangement or formation of such drain metal layer is known in the art, and description of such would be omitted herein for purpose of concise only.

FIGS. 3A-9C show a method of manufacturing a semiconductor device according to a second embodiment. The illustrated exemplary manufacturing method can be used, for example, to manufacture the semiconductor device 100 according to the first embodiment. The illustrated exemplary manufacturing method can be regarded as one example of many methods for manufacturing the semiconductor device 100 according to the first embodiment.

For concise, only a part of typical steps of all the process steps are shown. In addition, for clarity, for each process step shown, illustrations are given in conjunction with those along lines AA, BB, and CC of FIG. 1. For example, FIGS. 3A, 3B, and 3C correspond to a same step, and show the state of the cross-sectional device structure formed along AA, BB, and CC of FIG. 1 respectively under this step. This applies similarly to FIGS. 4A-9C.

Figure 3A:
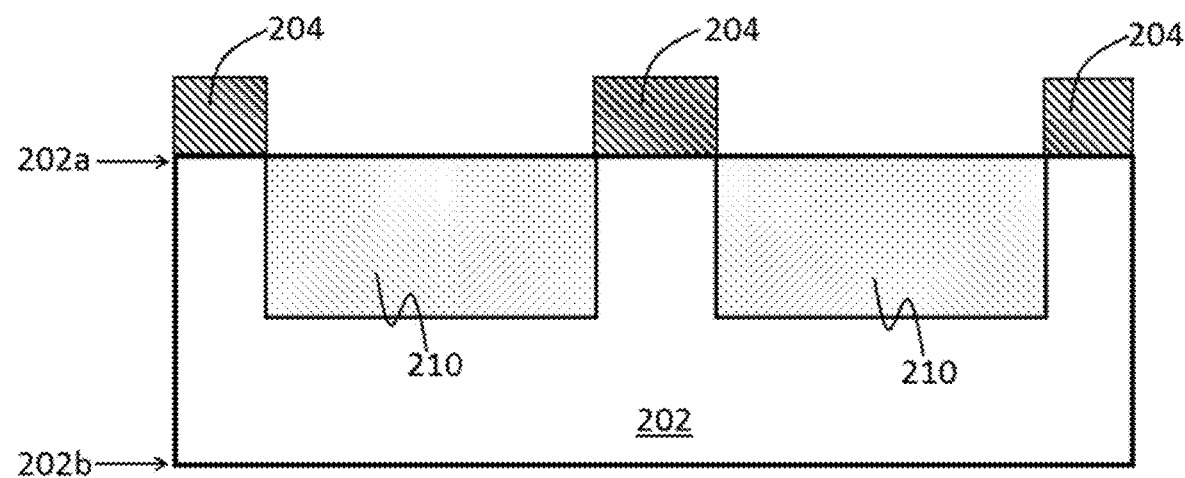
FIGS. 3A-3C are schematic diagrams of forming a well region according to a second embodiment of the present invention.
Figure 3B:
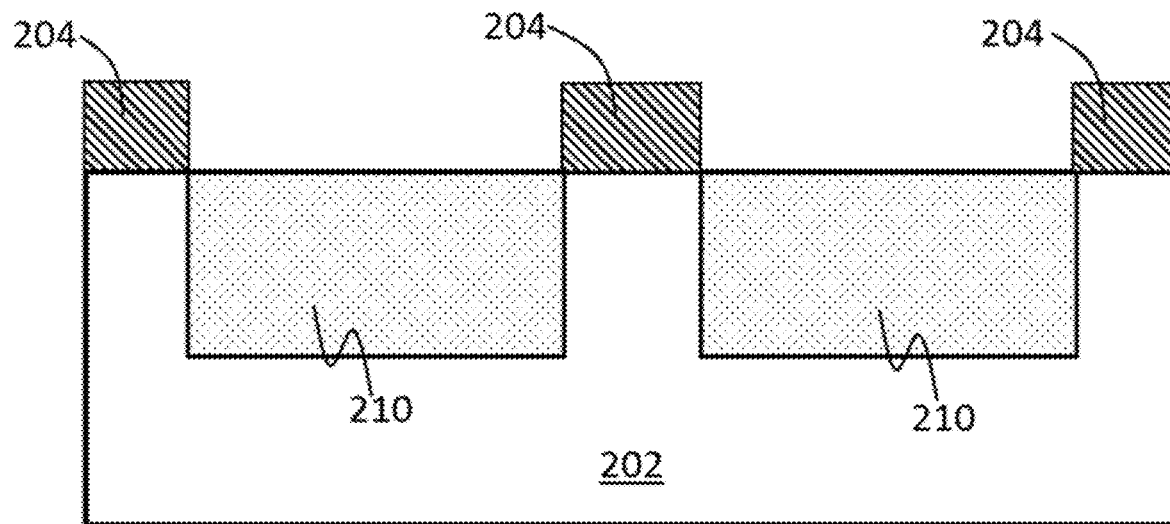
Figure 3C:
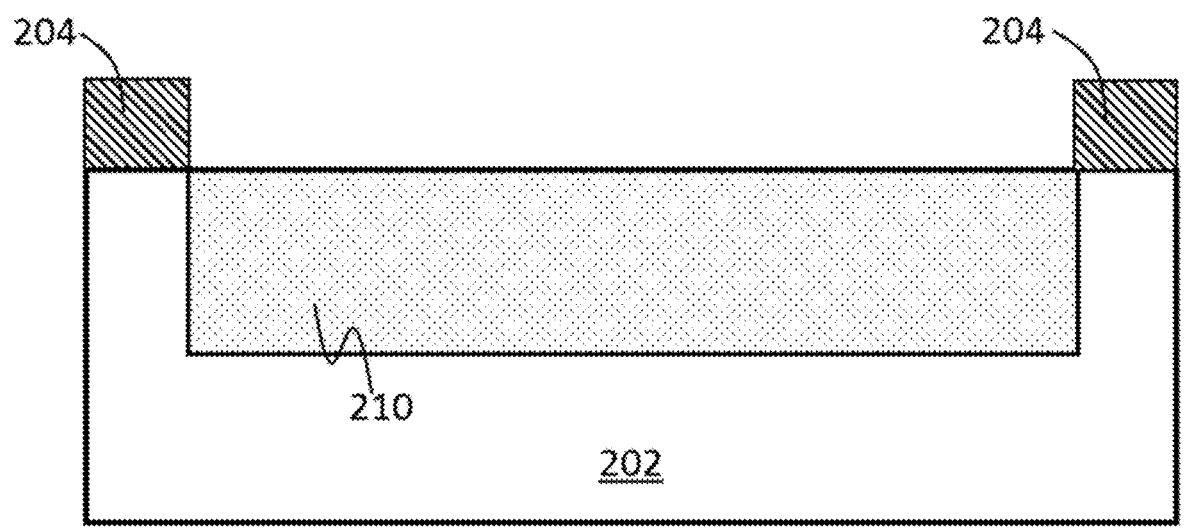

As shown in FIGS. 3A-3C, a semiconductor substrate 202 is provided and well regions 210 are formed in the substrate 202. The semiconductor substrate 202 is of the first conductivity type. For convenience of description hereinafter, the first conductivity type is illustrated as N-type, and the second conductivity type is illustrated as P-type. According to actual needs, the substrate 202 may include one or multiple epitaxial layers and drift layers and may have appropriate doping profiles and thickness combinations. The substrate 202 includes a semiconductor material, such as one of SiC, silicon, and the like.

In order to form the well regions 210, a first hard mask is formed on the first face 202a of the substrate 202 first. The first hard mask may be formed of a suitable oxide, such as silane (SiH4)-based oxide or tetraethyl orthosilicate (TEOS)-based oxide. The oxide as the first hard mask can be formed by an appropriate process, including but not limited to low pressure chemical vapor deposition (LPCVD), plasma-enhanced chemical vapor deposition (PECVD), high density plasma chemical vapor deposition (HDPCVD), etc. In the present particular embodiment, the first hard mask is formed by depositing plasma-enhanced tetraethyl orthosilicate (PETEOS).

Then the first hard mask is patterned to obtain a patterned first hard mask 204. In the present embodiment, photolithography, dry etching and/or wet etching are performed on the first hard mask to expose a portion of the first face 202a corresponding to the well regions 210 as a window for ion implantation. The P-type well regions 210 are formed by using the patterned first hard mask 204 as mask for ion implantation. For example, this may be realized by conducting aluminum ion implantation at a temperature ranging from 400° C. to 600° C.

Figure 4A:
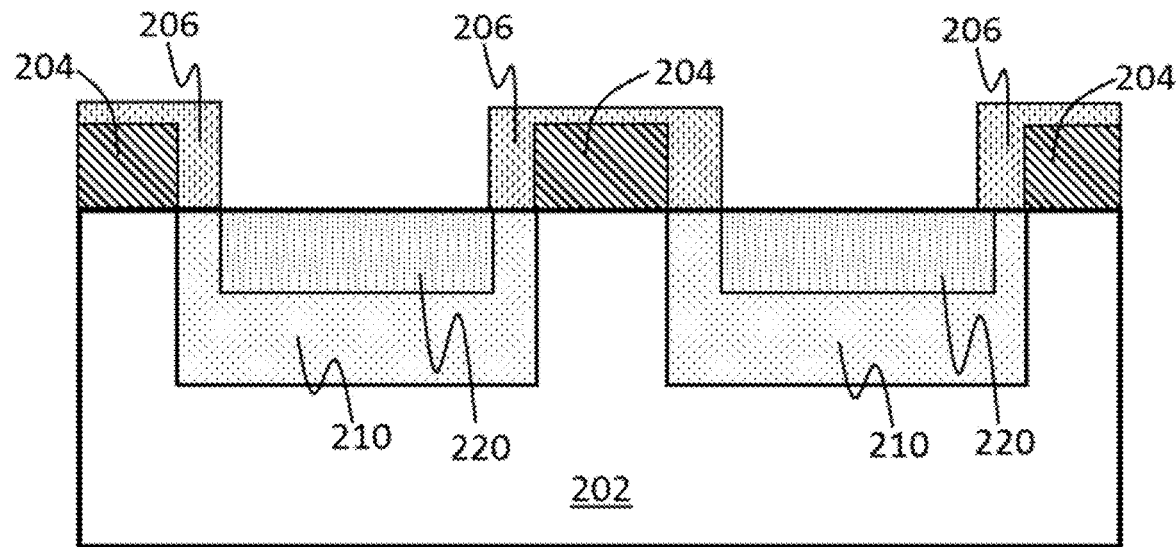
FIGS. 4A-4C are schematic diagrams of forming a source region according to the second embodiment of the present invention.
Figure 4B:
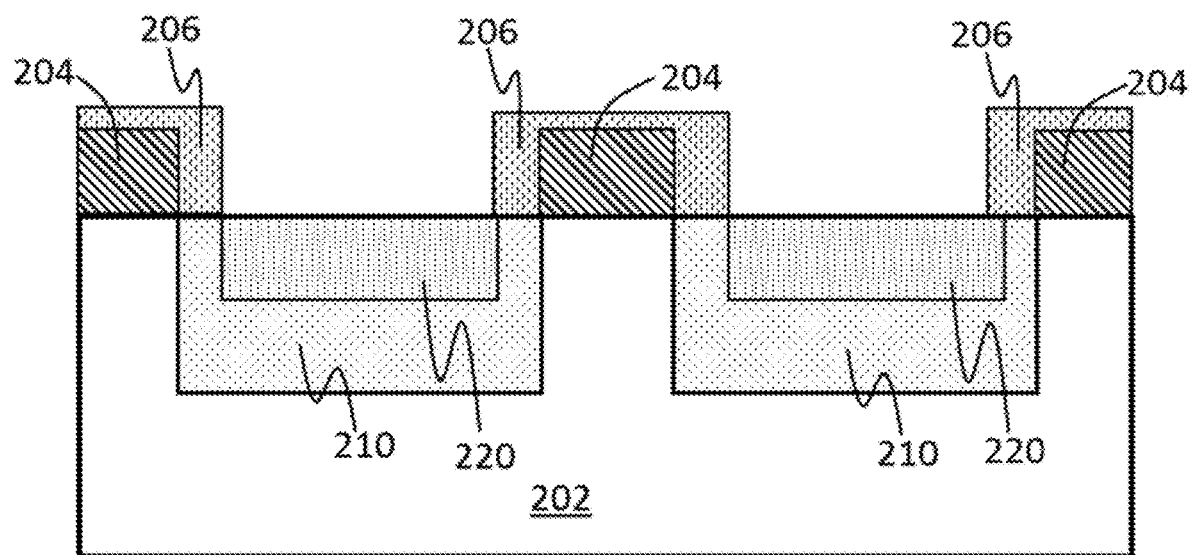
Figure 4C:
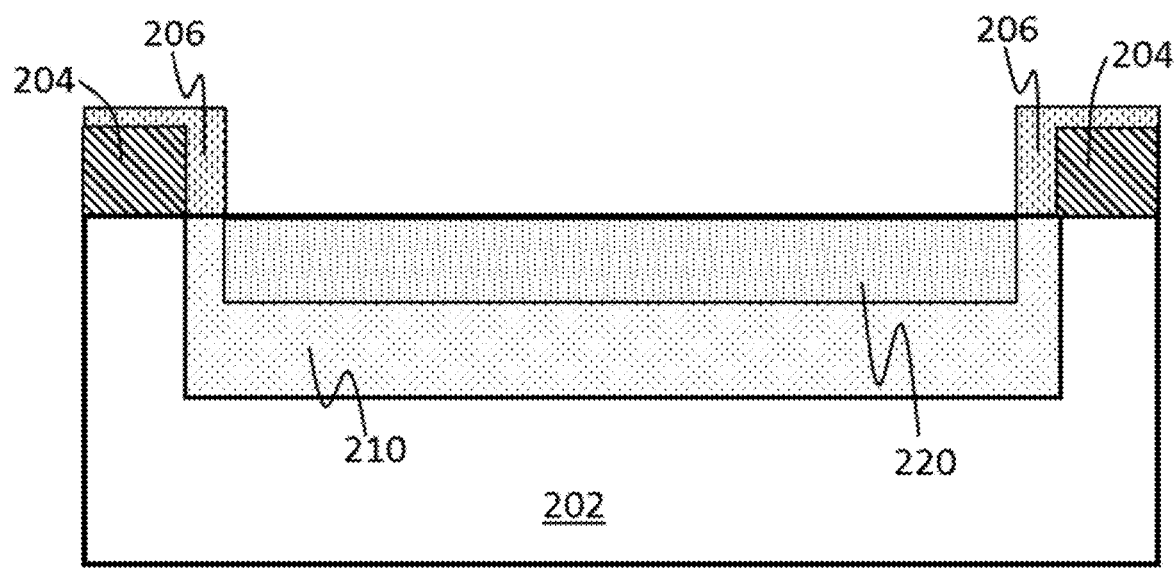

With reference to FIGS. 4A-4C, an oxide layer is formed on the patterned first hard mask 204 and the exposed portion of the first face 202a (i.e., the window corresponding to the well regions 210). The oxide layer is then patterned to obtain a spacers layer 206, thereby exposing a window on the first face 202a for forming source regions 220. Using the patterned first hard mask 204 and the spacer layer 206 as mask, an N-type ion implantation (for example, nitrogen ion implantation, phosphorus ion implantation, or the like) at a temperature ranging from 400° C. to 600° C. is performed to obtain the source regions 220.

Figure 5A:
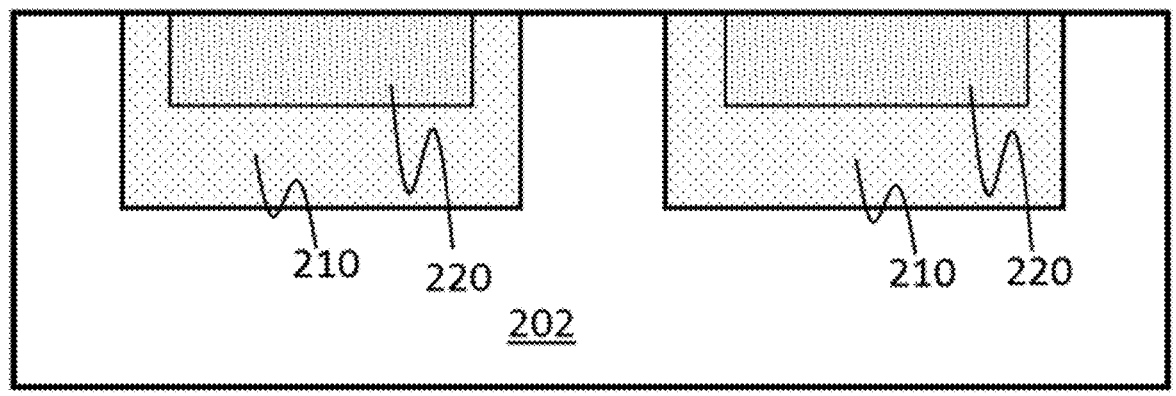
FIGS. 5A-5C are schematic diagrams of removing a first hard mask and a spacer layer according to the second embodiment of the present invention.
Figure 5B:
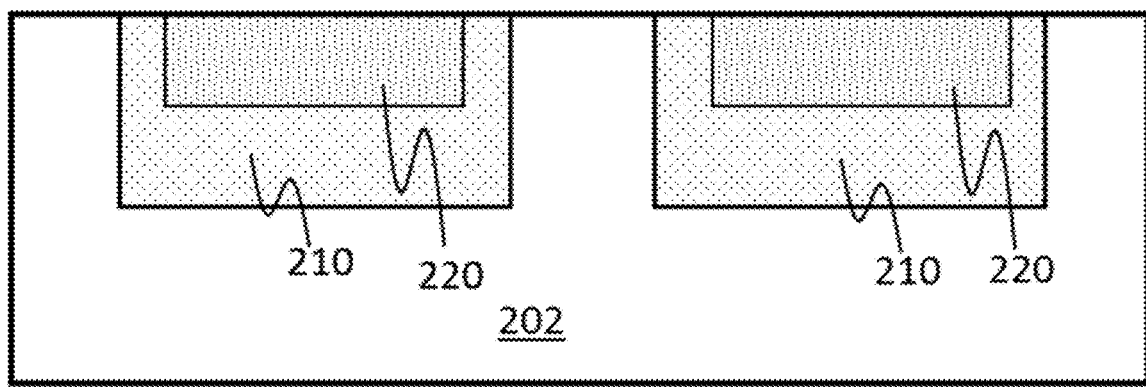
Figure 5C:
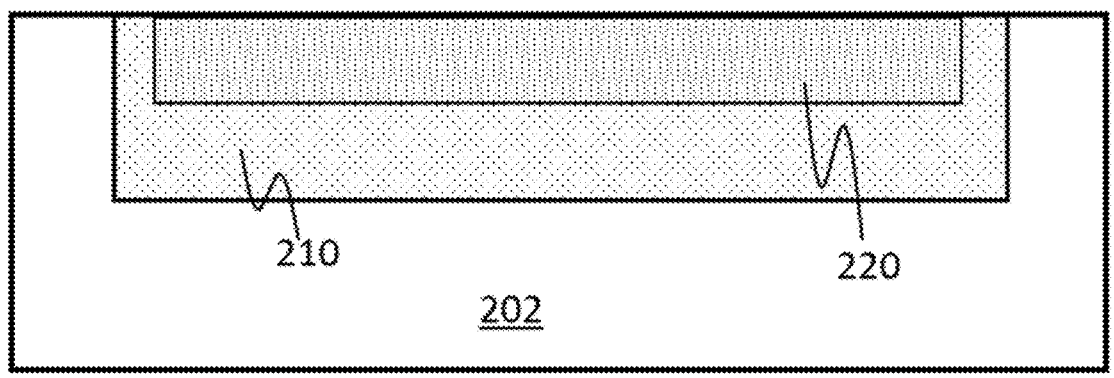
Figure 6A:
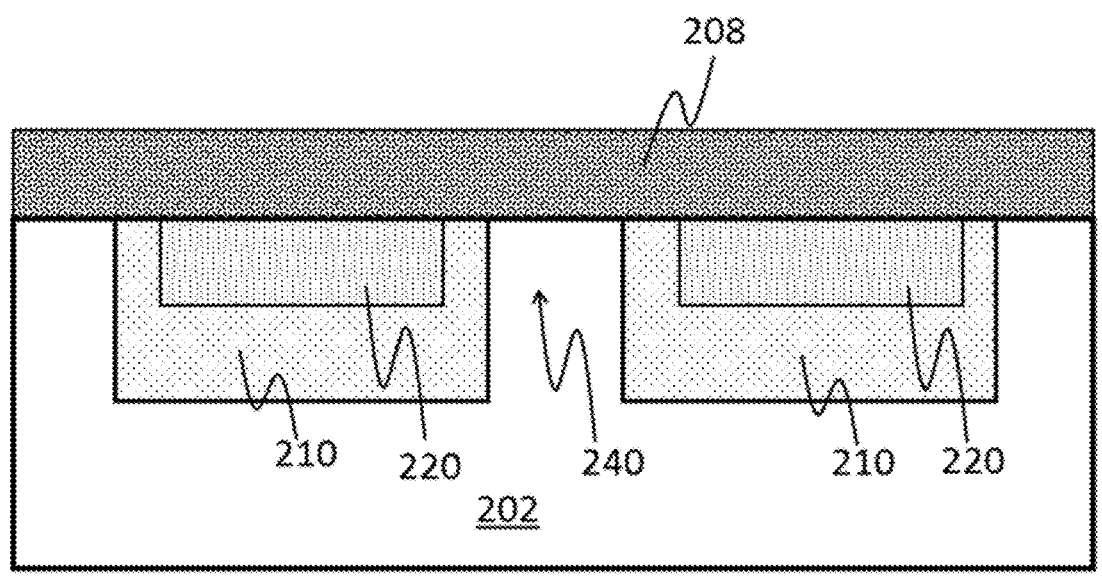
FIGS. 6A-6C are schematic diagrams of forming a second hard mask according to the second embodiment of the present invention.
Figure 6B:
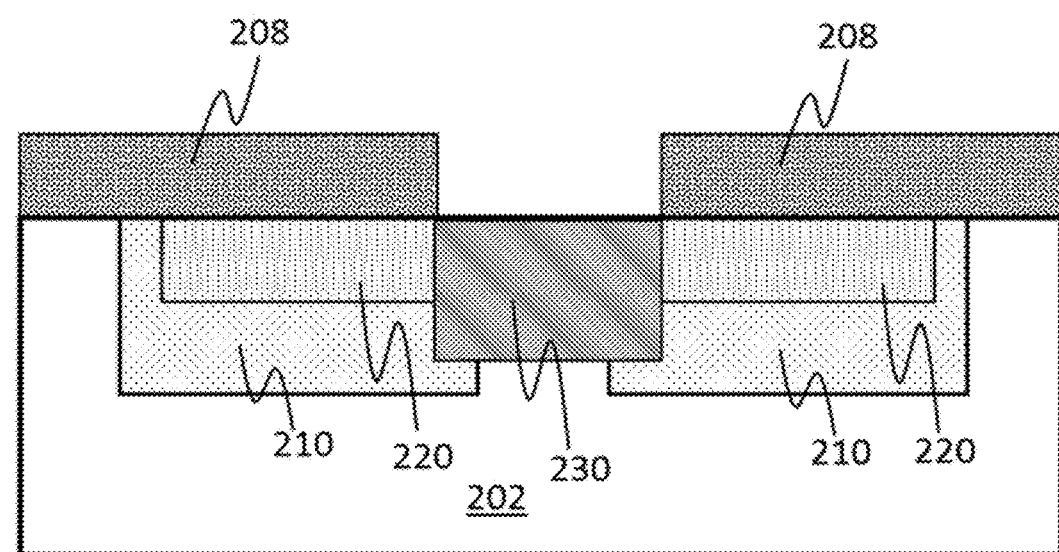
Figure 6C:
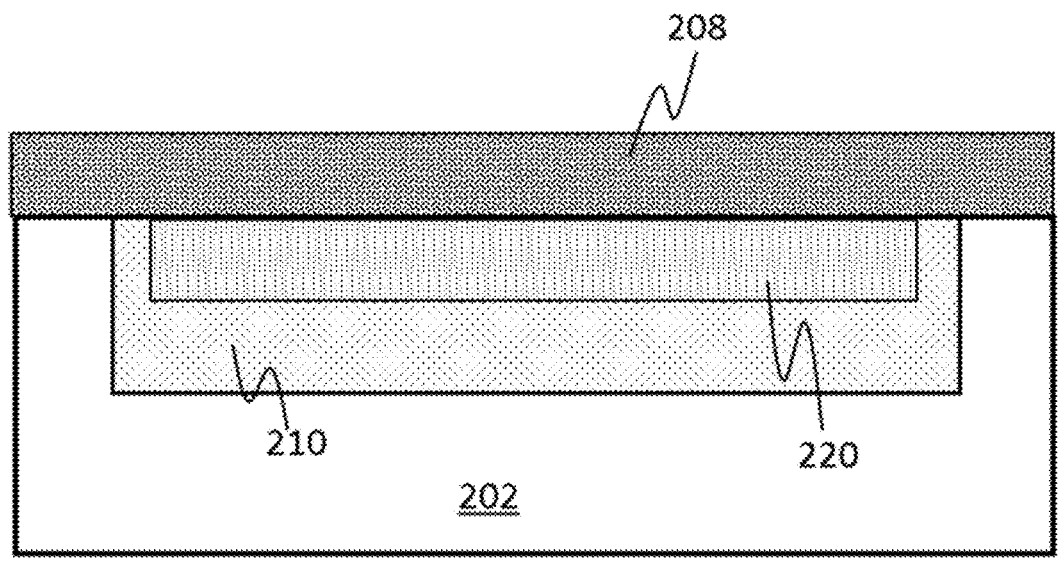

In FIGS. 5A-5C, the spacer layer 206 and the patterned first hard mask 204 are removed. In FIGS. 6A-6C, a second hard mask is formed on the first face 202a. The second hard mask is, for example, an oxide film or an oxide layer, which may include, for example, TEOS-based oxides such as PETEOS, SiH4-based oxides, and the like. The second hard mask is patterned to obtain a patterned second hard mask 208, thereby exposing a window on the first face 202a corresponding to contact region 230. P-type ion implantation (for example, aluminum ion implantation) at a temperature ranging from 400° C. to 600° C. is performed through the window to form the contact region 230. At least a part of the first face 202a is protected or concealed by the patterned second hard mask 208, so that a Schottky region 240 is formed extending downward from this part.

Figure 7A:
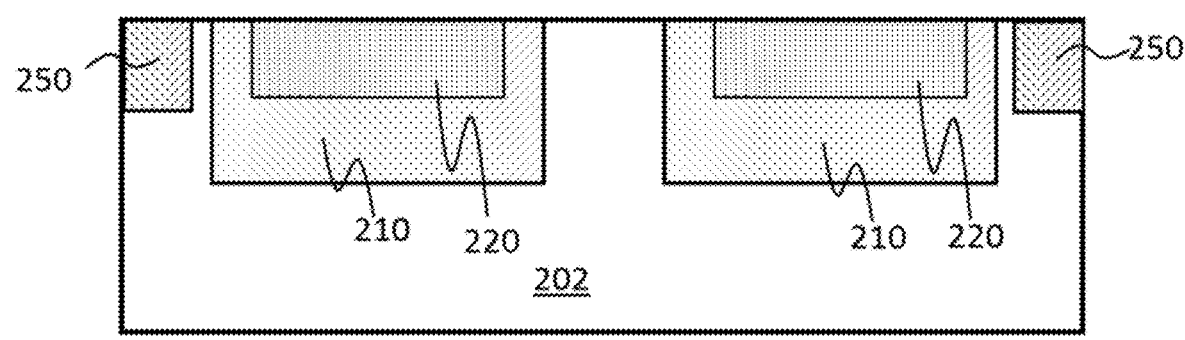
FIGS. 7A-7C are schematic diagrams of forming a contact area according to the second embodiment of the present invention.
Figure 7B:
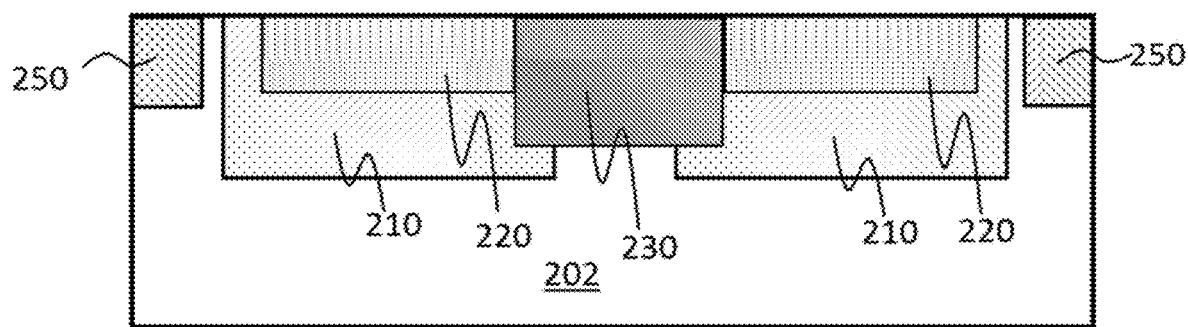
Figure 7C:
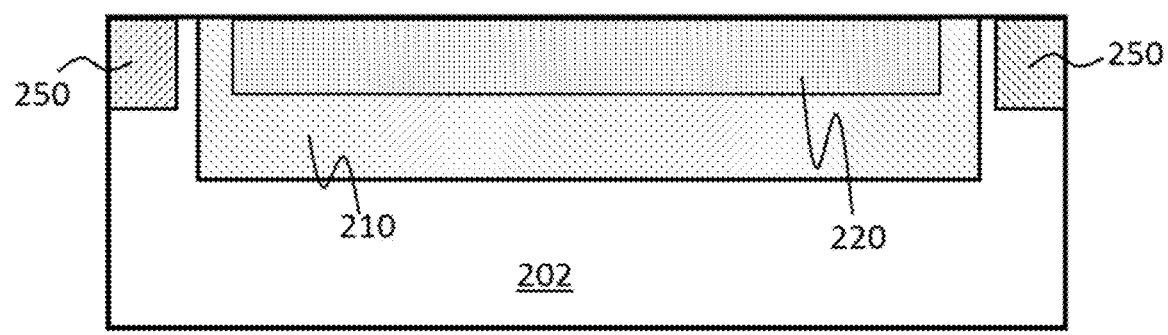
Figure 8A:
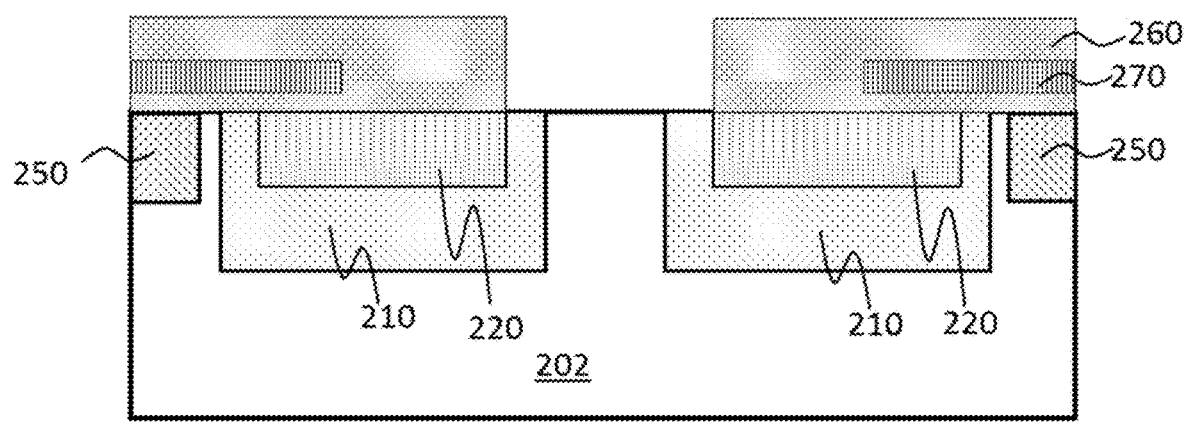
FIGS. 8A-8C are schematic diagrams of forming a dielectric layer and a gate according to the second embodiment of the present invention.
Figure 8B:
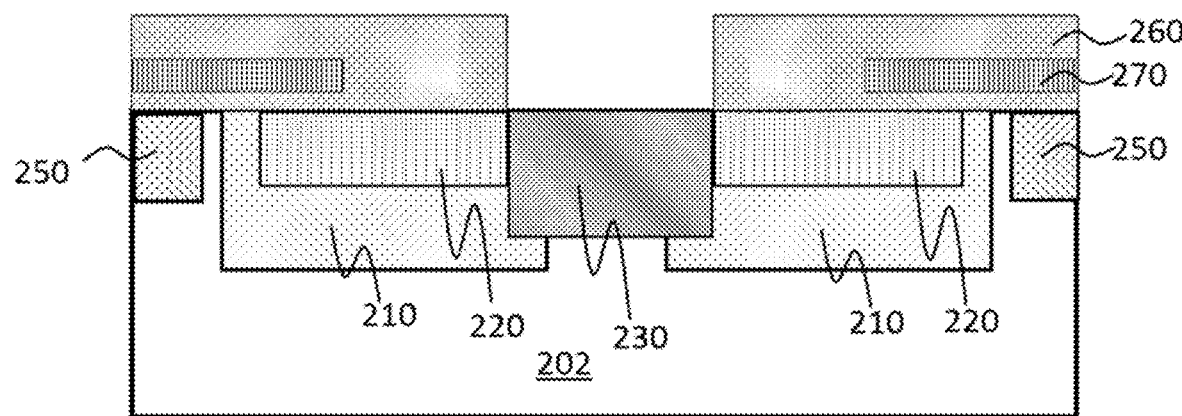
Figure 8C:
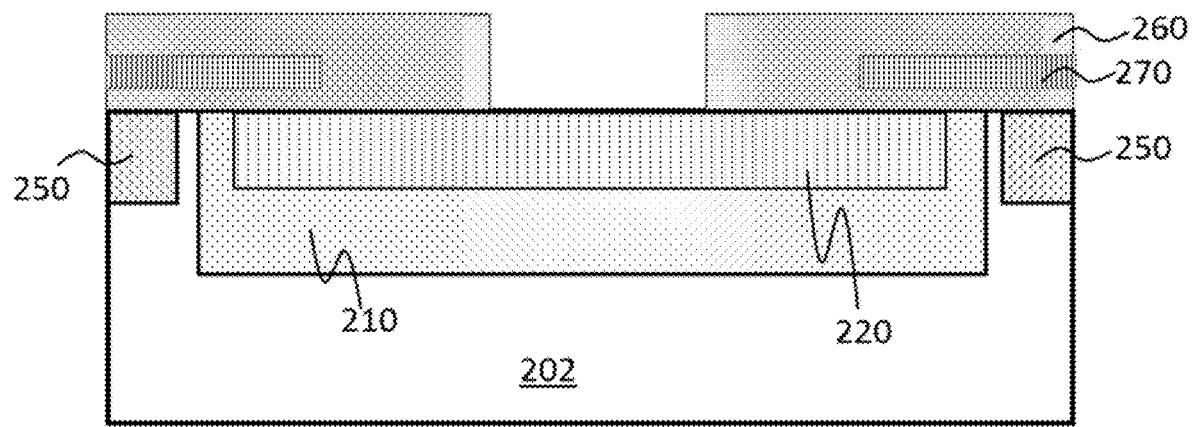

In FIGS. 7A-7C, the patterned second hard mask 208 is removed. N-type ion implantation is performed using a photoresist mask to form JFET regions 250. In FIGS. 8A-8C, a dielectric layer 260 and a gate 270 are formed. For example, silicon dioxide can be formed as a first dielectric layer or gate oxide layer on a part of the first face 202a, and then the gate 270 is formed. A second dielectric layer is formed on the gate 270 as well as on those parts of the first dielectric layer that are not covered by the gate 270, thereby providing protection and isolation for the gate 270.

Figure 9A:
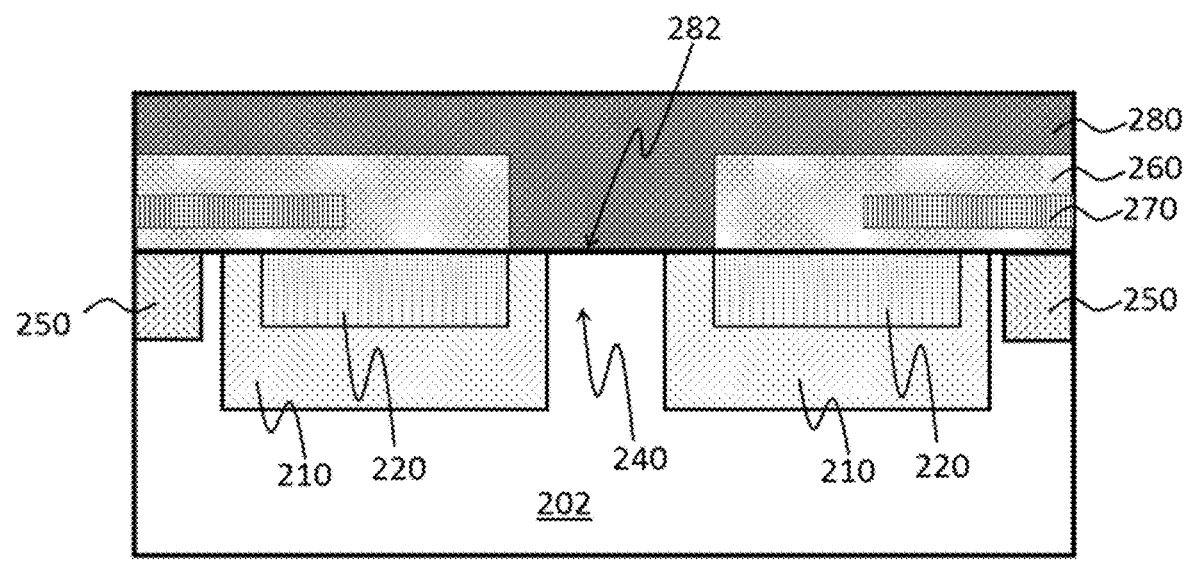
FIGS. 9A-9C are schematic diagrams of forming a source metal layer according to the second embodiment of the present invention.
Figure 9B:
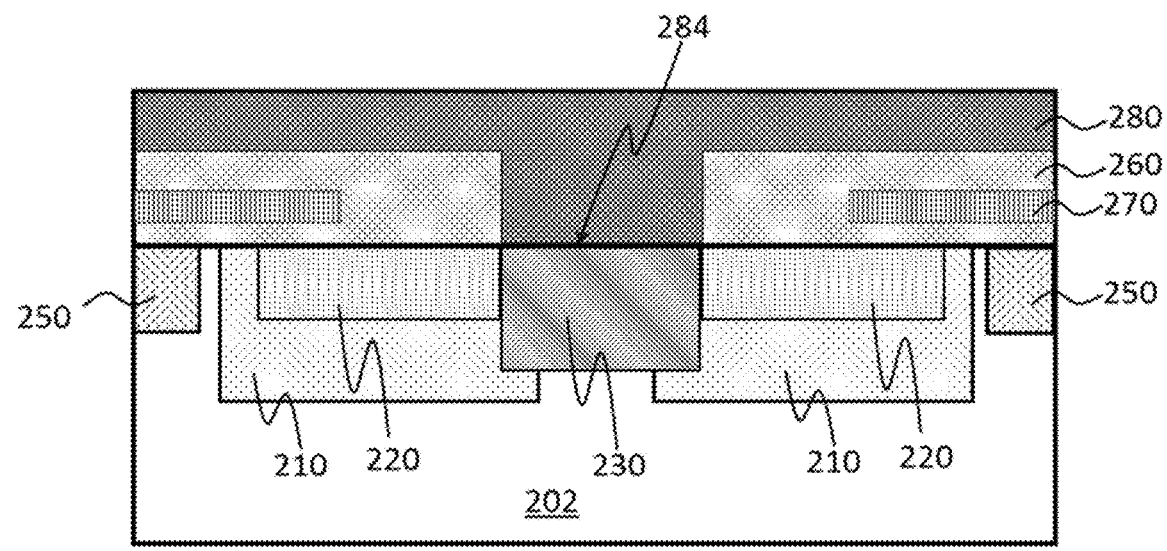
Figure 9C:
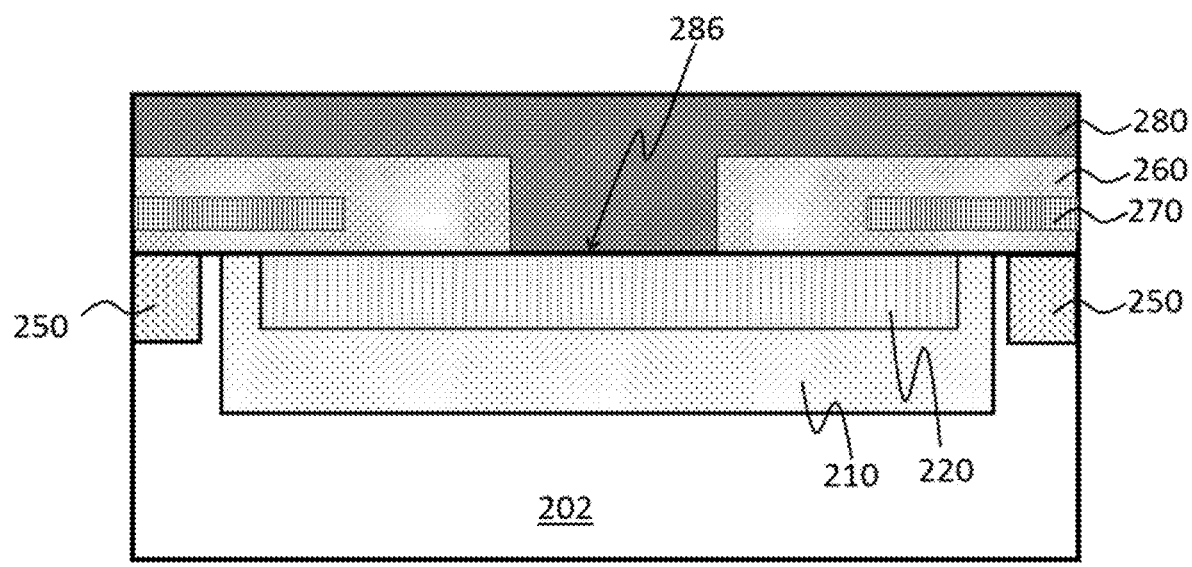

In FIGS. 9A-9C, a source metal layer 280 is formed. The source metal layer 280 may include one or more metal layers. For example, one of nickel (Ni), titanium (Ti), platinum (Pt), etc. may be deposited as Schottky contact metal layer and ohmic contact metal layer, and then subjected to rapid thermal annealing (RTA). Taking titanium as an example, annealing may be performed at 700° C. for 30 to 180 seconds. After etching out contact holes from the gate, aluminum with a thickness ranging from 2 um to 5 um is deposited as the top metal layer to form the source metal layer 280. The source metal layer 280 contacts the Schottky region 240 to form a Schottky diode or Schottky contact 282. The source metal layer 280 forms an ohmic contact 284 with the contact region 230, and forms an ohmic contact 286 with the source regions 220.

After formation of the source metal layer 280, one or more metal layers may be formed (such as deposited) onto the opposite face (i.e. the second face 202b) of the substrate 202 as a drain metal layer to form ohmic contact with the substrate 202. Illustration of formation of the drain metal layer is omitted for concise as this is known in the art.

According to the process methods shown above, no new extra mask is necessary. Rather, windows of hard masks can be designed to embed Schottky diode into the semiconductor device to improve device performance. This does not increase the process cost, and in the meanwhile can realize device improvement. Further, self-aligned method is adopted to form source regions, which not only saves the cost of the masks, but also realizes stability and consistency of the conductive channels.

The above embodiments are only for the purpose of exemplifying the ideas of example embodiments, rather than limiting the present invention. For example, the methods shown in FIGS. 3A-9C are only illustrative. Those skilled in the art can conceive of one or more other method variations without inventive efforts after reading the present disclosure.

In the above embodiments, the first conductivity type is N-type, and the second conductivity type is P-type. Those skilled in the art should understand that the first conductivity type may also be P-type, and the second conductivity type may also be N-type.

Those skilled in the art should also understand that, for the purpose of clear illustration, the elements (such as components, regions, layers, etc.) in the drawings are not drawn according to actual scale. Each element in the drawings is not necessarily its actual shape. In actual devices, many regions, such as well regions, source regions, and contact regions, are usually not in regular geometric shapes. For example, the corners are usually rounded, rather than regular right angles. Another example is the spacer layer 206 shown in FIG. 4C, which is generally irregular in shape with uneven thickness. The ways to deal with these matters herein are only for the purpose of explaining the ideas of example embodiments, and is also a common practice in this field, and will not impair the clarity of the explanation.

The semiconductor device may also have multiple repeating units. For example, the semiconductor device 100 shown in FIG. 1 may include a plurality of well regions, source regions, Schottky regions, contact regions, JFET regions, and the like. For clarity, multiple repeating units are not shown. In addition, the term "semiconductor device" as used herein may refer to either a repeating unit or cell itself, or a device composed of several cells arranged periodically.

What FIGS. 2A-2D show are schematic diagrams of the structure along cross-sections perpendicular to the plane shown in FIG. 1. For clarity, a gate, a dielectric layer, and a source metal layer are added to FIGS. 2A-2D. This is only for more clearly showing the device structure relationship on the first face of the substrate.

In FIGS. 2B and 9B, the depth of the contact region is illustrated to be smaller than the depth of the well region. This is merely illustrative. In some other embodiments, the depth of the contact region may be equal to or greater than the depth of the well region.

In the above embodiments, the ion implantation mentioned can be one ion implantation or multiple ion implantations, such as a chain of implantations for adjusting the impurity profile.

In the above embodiments, the semiconductor device may include a MOSFET, an insulated gate bipolar transistor (IGBT), or other types of semiconductor devices.

Unless otherwise defined, the technical and scientific terms used herein have the plain meanings as commonly understood by those skill in the art to which the example embodiments pertain. Embodiments are illustrated in non-limiting examples. Based on the above disclosed embodiments, various modifications that can be conceived of by those skilled in the art fall within scope of the example embodiments.

What is claimed is:

1. A method of manufacturing a semiconductor device, comprising:
    providing a substrate of a first conductivity type, the substrate having a first face and a second face;
    forming a well region of a second conductivity type in the substrate such that the well region is disposed in the substrate and extends from the first face toward the second face, the second conductivity type being opposite to the first conductivity type;
    forming a source region of the first conductivity type in the well region such that the source region is disposed in the well region and extends from the first face toward the second face;
    forming a Schottky region of the first conductivity type and a contact region of the second conductivity type in the substrate simultaneously such that the contact region contacts the well region and the source region, and such that in a first plane perpendicular to a direction from the first face to the second face, the Schottky region is surrounded by the well region and the contact region, wherein the boundary of the Schottky region in the first plane is in a form of quadrilateral, and a first opposite sides of the quadrilateral contact the well region, and a second opposite sides of the quadrilateral contact the contact region; and
    forming a source metal layer on the first face such that a first portion of the source metal layer contacts the Schottky region to form a Schottky diode with the Schottky region, a second portion of the source metal layer forms ohmic contact with the contact region, and a third portion of the source metal layer forms ohmic contact with the source region.

2. The method according to claim 1, wherein the step of forming the well region comprises:
    forming a first hard mask on the first face;
    patterning the first hard mask to obtain a patterned first hard mask; and
    conducting ion implantation of the second conductivity type to form the well region by using the patterned first hard mask as mask.

3. The method according to claim 2, wherein the step of forming the source region comprises:
    forming an oxide layer on the patterned first hard mask and an exposed portion of the first face;
    patterning the oxide layer to obtain a spacer layer; and
    conducting ion implantation of the first conductivity type to obtain the source region by using the patterned first hard mask and the spacer layer as mask.

4. The method according to claim 3, wherein the step of forming the contact region and the Schottky region comprises:
    removing the spacer layer and the patterned first hard mask;
    forming a second hard mask on the first face;
    patterning the second hard mask to obtain a patterned second hard mask; and
    conducting ion implantation of the second conductivity type by using the patterned second hard mask as mask to form the contact region such that at least a part of the first face is protected by the patterned second hard mask for forming Schottky contact with the Schottky region.

5. The method according to claim 4, further comprising:
    removing the patterned second hard mask; and
    conducting ion implantation of the first conductivity to form a JFET region by using a photoresist mask.

6. The method according to claim 1, further comprising, before forming the source metal layer,
    forming a first dielectric layer on a part of the first face;
    forming a gate on a part of the first dielectric layer; and
    forming a second dielectric layer on the other part of the first dielectric layer and the gate.

* * * * *